(12) United States Patent
Mai et al.

(10) Patent No.: US 8,613,550 B2
(45) Date of Patent: Dec. 24, 2013

(54) SLIDE COVER STABILIZATION AND SYNCHRONIZATION MECHANISM

(75) Inventors: Chien Cheng Mai, Taipei County (TW); Way Han Dai, Taipei County (TW); An Szu Hsu, Taipei County (TW)

(73) Assignee: First Dome Corporation, Taipei County (TW)

( * ) Notice: Subject to any disclaimer, the term of this patent is extended or adjusted under 35 U.S.C. 154(b) by 218 days.

(21) Appl. No.: 13/101,354

(22) Filed: May 5, 2011

(65) Prior Publication Data
US 2012/0237145 A1    Sep. 20, 2012

(30) Foreign Application Priority Data

Mar. 17, 2011  (TW) .............................. 100204722 A

(51) Int. Cl.
*F16C 21/00* (2006.01)
(52) U.S. Cl.
USPC ............................................ 384/26; 384/58
(58) Field of Classification Search
USPC ............. 384/7, 18–21, 23, 26, 40–42, 50, 53, 384/54, 57, 58, 59; 455/575.4
See application file for complete search history.

(56) References Cited

U.S. PATENT DOCUMENTS

| | | | |
|---|---|---|---|
| 6,478,466 B1* | 11/2002 | Chang et al. | 384/49 |
| 7,209,772 B2* | 4/2007 | Crisp | 455/575.4 |
| 2003/0197453 A1* | 10/2003 | Jurja | 312/334.46 |
| 2004/0239220 A1* | 12/2004 | Yang | 312/334.44 |
| 2007/0058888 A1* | 3/2007 | Chen et al. | 384/19 |
| 2009/0320244 A1* | 12/2009 | Lin | 16/362 |
| 2010/0000052 A1* | 1/2010 | Chung | 16/364 |

* cited by examiner

*Primary Examiner* — Phillip A Johnson
(74) *Attorney, Agent, or Firm* — Rosenberg, Klein & Lee

(57) ABSTRACT

A slide cover stabilization/synchronization mechanism includes a slide seat, a base seat and two elastic abutment assemblies. Two slide guide sections, which can be guide rails, are disposed on two lateral sides of the slide seat in parallel to each other. Two holding sections are disposed on two lateral sides of the base seat for fitting with the slide guide sections. The elastic abutment assemblies are respectively disposed on the each holding section. The elastic abutment assemblies respectively at least partially elastically abut against the slide guide sections directly or indirectly. Accordingly, the base seat can be stably and smoothly slid along the slide guide sections without deflection.

46 Claims, 6 Drawing Sheets

SLIDE COVER STABILIZATION AND SYNCHRONIZATION MECHANISM

BACKGROUND OF THE INVENTION

1. Field of the Invention

The present invention relates generally to a slide cover stabilization/synchronization mechanism. By means of the slide cover stabilization/synchronization mechanism, a user can smoothly operate the slide cover without deflection thereof. Also, by means of the slide cover stabilization/synchronization mechanism, the gap between the slide seat and the base seat is minified to stabilize the operation and reduce wear of the components.

2. Description of the Related Art

Various slide cover structures have been developed and applied to electronic devices. For example, Taiwanese Patent Publication No. 1328088 discloses a typical slide module and a portable electronic device adopting the slide module. The slide module includes a fixed system and a movable system. A fixed frame is fixedly connected to the fixed system and a movable frame is fixedly connected to the movable system. Two reverse hook sections are disposed on two sides of the fixed frame. The two lateral edges of the movable frame are fitted and received in the reverse hook sections, whereby the movable system can be moved relative to the fixed system between a first position and a second position. In the above structure, the two lateral edges of the movable frame are in fact contact with the hook sections of the fixed frame. Therefore, in sliding movement, there is a greater friction between the movable frame and the fixed frame. In order to avoid affection of excessively great friction on the smoothness of the sliding movement, a certain gap is preserved between the hook sections of the fixed frame and the lateral edges of the movable frame so as to reduce the frictional resistance against the sliding movement. Such structure is practically applicable to small-size electronic products such as cellular phones, handheld game machines and personal digital assistants (PDA). However, such structure can be hardly applied to a large-size electronic product such as a laptop computer or a tablet computer. This is because the movable system will have a heavier weight and it is necessary to move the movable system through a longer distance. When applying a push force to one single side of the movable system, the movable system is very likely to be biased. This will affect the smoothness of the sliding movement of the movable system. In some more serious cases, the movable system may be stuck with no possibility of moving. As a result, the lifetime of the slide cover structure may be shortened and the ratio of defective products may increase.

It is therefore tried by the applicant to provide a slide cover structure (movable system), which can be more conveniently operated to overcome the shortcomings existing in the conventional slide cover structure.

SUMMARY OF THE INVENTION

It is therefore a primary object of the present invention to provide a slide cover stabilization/synchronization mechanism. By means of the slide cover stabilization/synchronization mechanism, when a push force is applied to one single side of the slide cover, the slide cover can be still stably and smoothly slid without deflection.

It is a further object of the present invention to provide the above slide cover stabilization/synchronization mechanism, which the gap between the slide seat and the base seat is minified to stabilize the operation and reduce wear of the components.

It is still a further object of the present invention to provide the above slide cover stabilization/synchronization mechanism, which has a wider application range and can be assembled with various slide covers with different sizes.

To achieve the above objects and effects, the slide cover stabilization/synchronization mechanism of the present invention includes: a slide seat having two slide guide sections extending in parallel to each other; a base seat having two holding sections for fitting with the slide guide sections, whereby the base seat can be moved along the slide guide sections relative to the slide seat; and at least one elastic abutment assembly disposed on at least one of the holding sections. The elastic abutment assembly is positioned between the holding section and the slide guide section to at least partially elastically abut against the slide guide section. Accordingly, the base seat can be slid relative to the slide seat to automatically elastically correct deflection.

In the above slide cover stabilization/synchronization mechanism, each elastic abutment assembly includes an elastic member and a rolling member. The elastic member at least partially elastically abuts against the holding section, while the rolling member elastically abuts against the slide guide section under elastic force of the elastic member.

In the above slide cover stabilization/synchronization mechanism, each elastic abutment assembly further includes a movable seat disposed between the rolling member and the elastic member. A bushing section is disposed on a first side of the movable seat and at least one cavity being formed on a second side of the movable seat opposite to the first side for receiving the elastic member. The rolling member has a central pivot shaft inserted in the bushing section.

In the above slide cover stabilization/synchronization mechanism, an outer jacket member is fixedly fitted on outer side of each holding section of the base seat. The outer jacket member has a receiving space in which the elastic abutment assembly is received.

In the above slide cover stabilization/synchronization mechanism, each end section of each slide guide section is formed with at least one recessed locating section.

The present invention can be best understood through the following description and accompanying drawings, wherein:

DETAILED DESCRIPTION OF THE PREFERRED EMBODIMENTS

Figure 1:
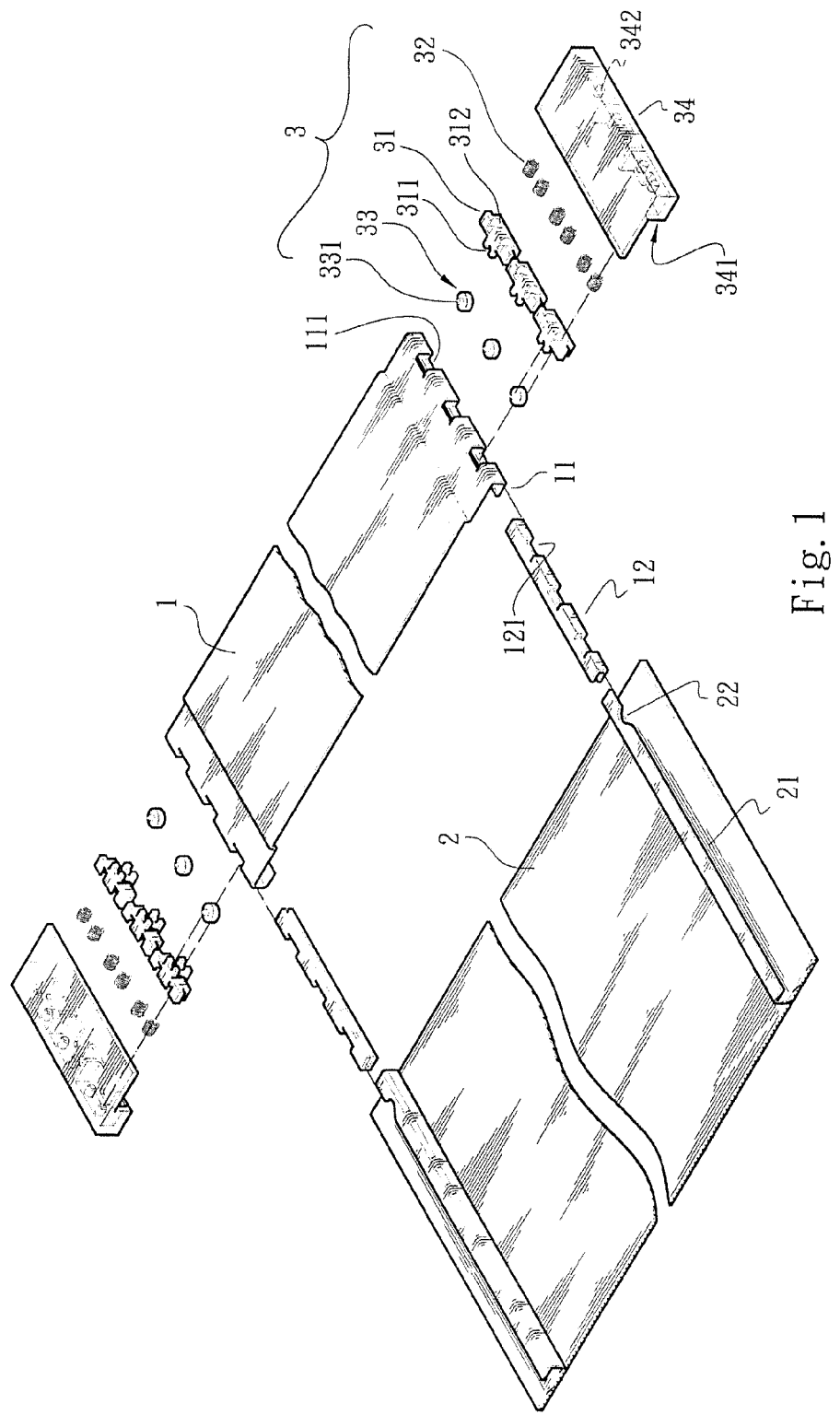
FIG. 1 is a perspective exploded view of the present invention.
Figure 2:
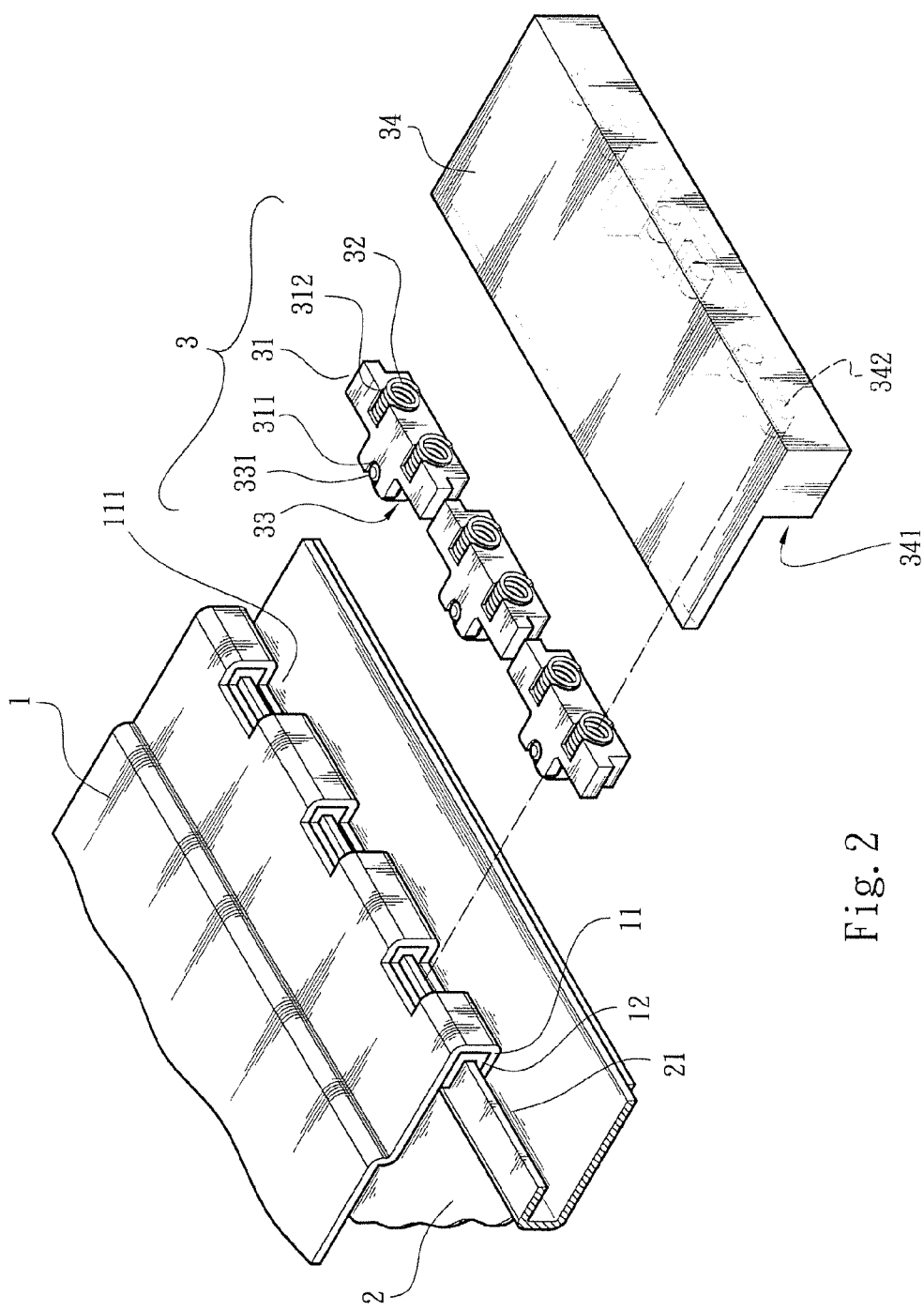
FIG. 2 is a perspective partially assembled view of the present invention.
Figure 3:
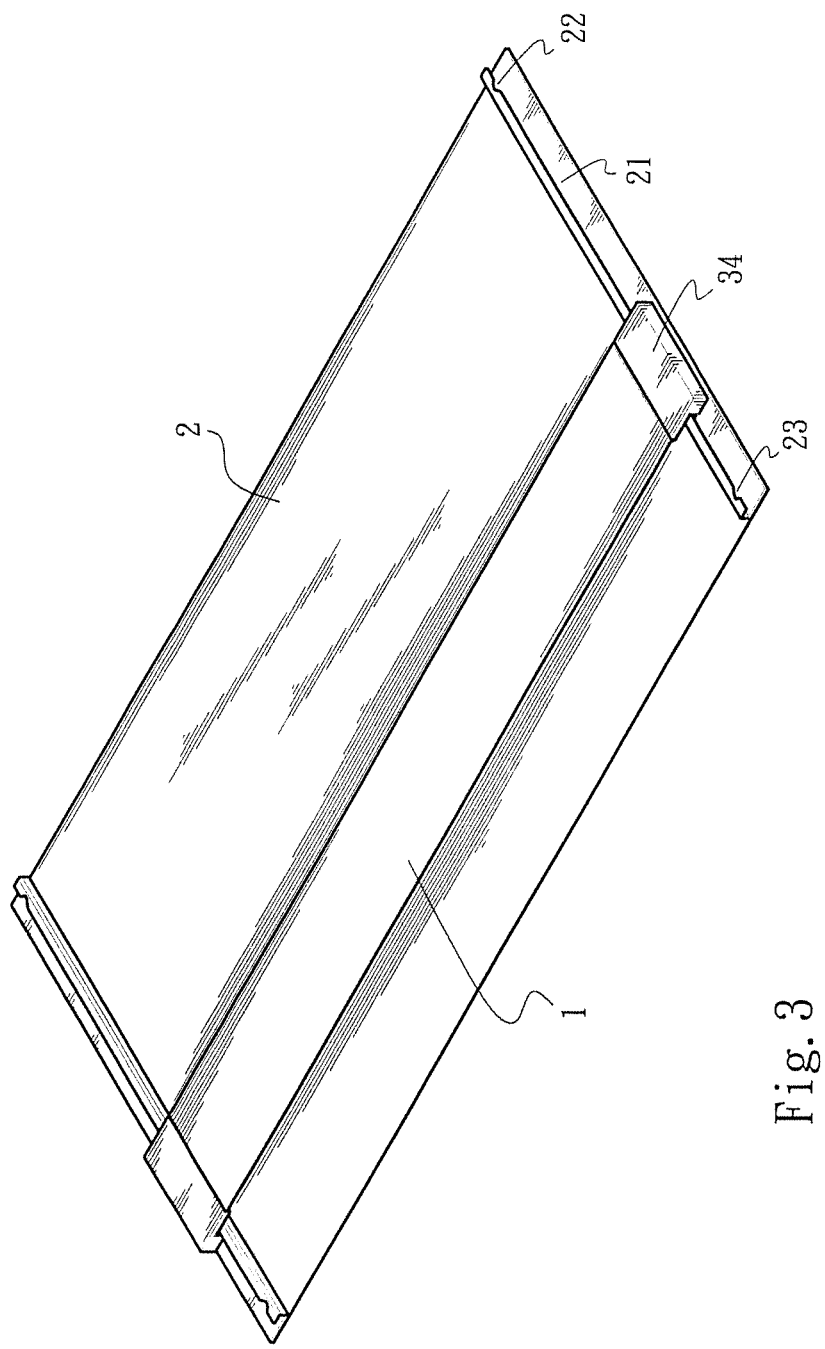
FIG. 3 is a perspective assembled view of the present invention.

Please refer to FIGS. 1 to 3. The present invention includes a base seat 1, a slide seat 2 and elastic abutment assemblies 3.

The slide seat 2 can be an independent slide cover structure or synchronously drivingly connected with a slide cover. Two slide guide sections 21, (which can be guide rails), are disposed on two lateral sides of the slide seat 2 in parallel to each other. Two end sections of each slide guide section 21 can be formed with recessed locating sections 22, 23 as necessary. The base seat 1 can be a part of the case of an electronic device or connected to the case of an electronic device. Two U-shaped holding sections 11 are disposed on two lateral sides of the base seat 1 for fitting with the slide guide sections 21. Two inner holding members 12 with the same configuration as the holding sections 11 can be respectively disposed in the holding sections 11 to more tightly hold the slide guide sections 21. The holding sections 11 and the inner holding members 12 are respectively formed with corresponding hollow receiving sections 111, 121 through which the slide guide sections 21 are partially exposed to outer side. Each elastic abutment assembly 3 includes at least one (preferably plural) movable seat 31, at least one (preferably plural) elastic member 32, (which can be a spring), at least one (preferably plural) rolling member 33, (which can be a roller), and at least one (preferably plural) outer jacket member 34. A bushing section 311 is disposed on a first side of each movable seat 31. Multiple cavities 312 are formed on a second side of the movable seat 31 opposite to the first side. One end of each elastic member 32 extends into the cavity 312. Each rolling member 33 has a central pivot shaft 331 fitted in the bushing section 311, whereby the rolling member 33 can be freely rotated relative to the movable seat 31. Each outer jacket member 34 has a receiving space 341 in which the movable seats 31 are received and in which the outer side of the holding section 11 is fitted. Multiple locating projections 342 are disposed in the receiving space 341 corresponding to the cavities 312 for locating the elastic members 32 in the cavities 312. Also, the outer jacket member 34 is fitted on the outer side of the holding section 11 to locate the movable seats 31.

Figure 5:
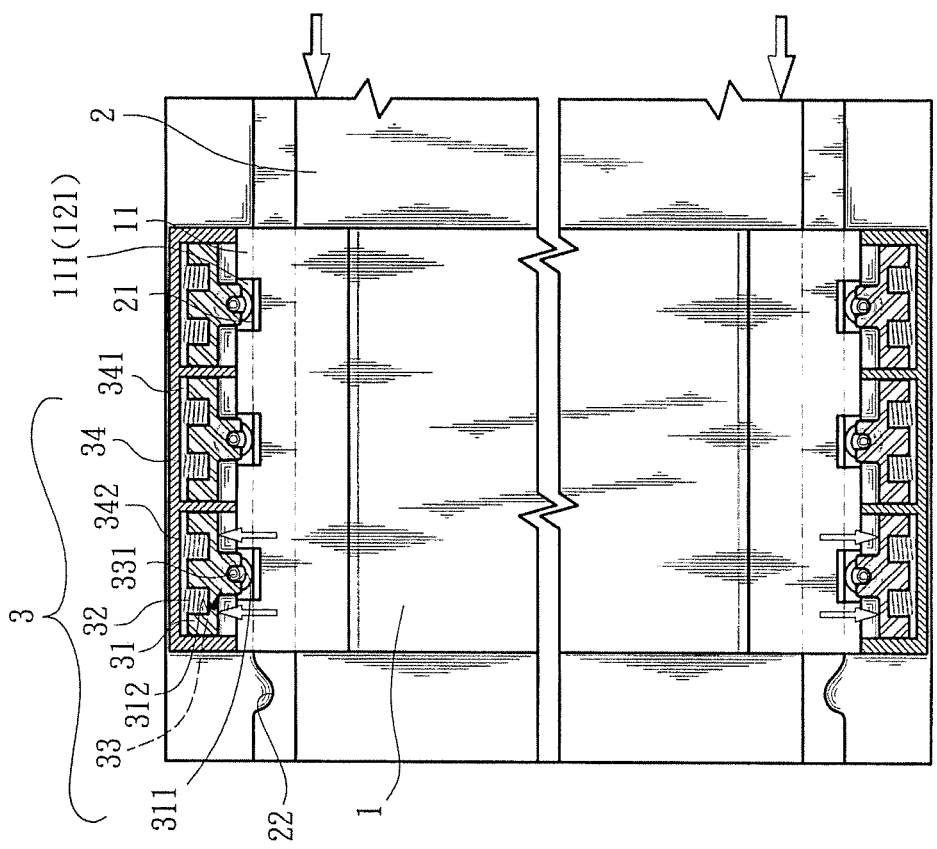
FIG. 5 is a sectional view of the present invention, showing the operation thereof at a second stage.
Figure 4:
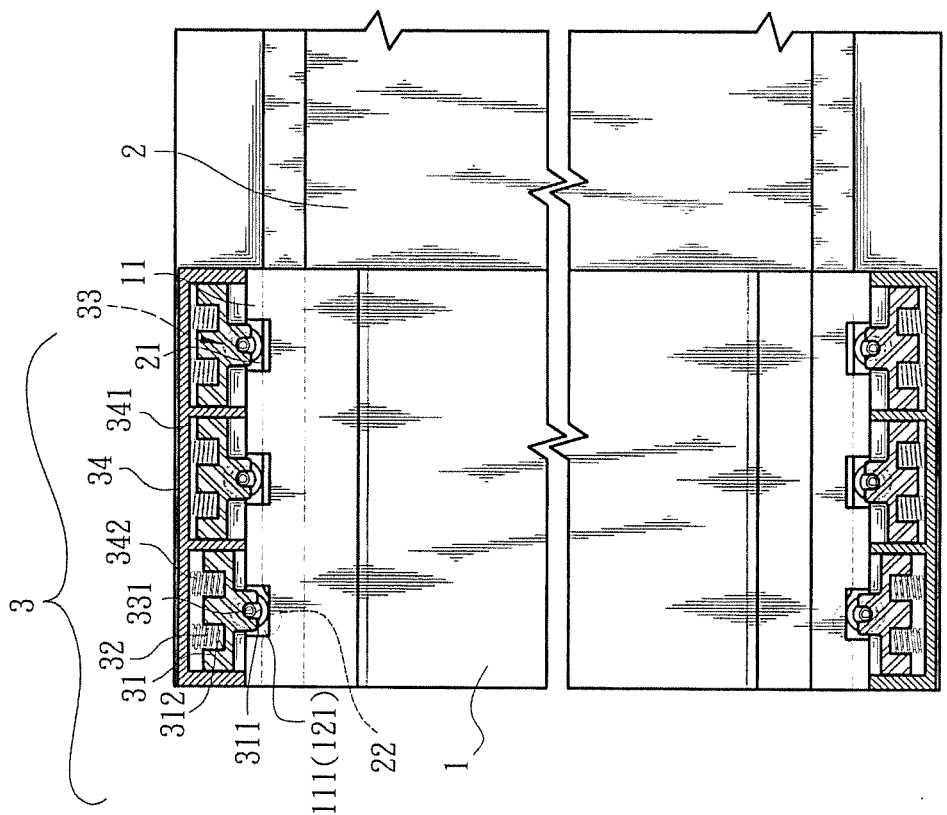
FIG. 4 is a sectional view of the present invention, showing the operation thereof at a first stage.
Figure 6:
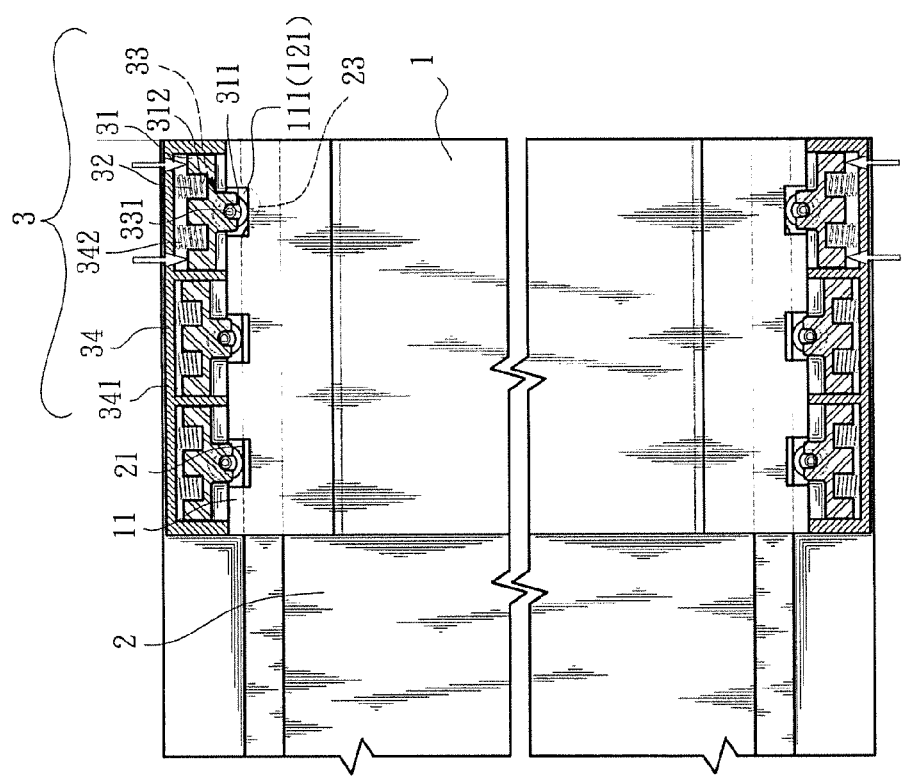
FIG. 6 is a sectional view of the present invention, showing the operation thereof at a third stage.

Please refer to FIGS. 4 to 6. In operation, the elastic members 32 abut against the movable seats 31, whereby the rolling members (rollers) 33 are positioned on two lateral sides of the base seat 1 to elastically abut against the slide guide sections (guide rails) 21 of the slide seat 2. Accordingly, both sides of the base seat 1 are uniformly elastically supported so that the base seat 1 can be stably connected with the slide guide sections (guide rails) 21 without deflection. Also, due to the low rolling friction against the rolling members (rollers) 33, when a force (normal force or deflection force) is applied to the base seat 1 (or the slide seat 2), the base seat 1 can smoothly relatively slide along the slide guide sections 21 as shown in FIG. 5. When at least one rolling member (roller) 33 of the elastic abutment assembly 3 is moved to the locating section 22 or 23, the rolling member 33 will be elastically inlaid the recessed locating section 22 or 23 under the elastic force of the elastic member (spring) 32 (as shown in FIGS. 4 and 6). Under such circumstance, the base seat 1 and the slide seat 2 can be located in a slide cover opening or closing position of the electronic device.

In practice, the rolling members (rollers) 33 and the movable seats 31 can be omitted and the elastic members 32 can be leaf springs in direct contact with the holding sections 11 and the slide guide sections 21 to achieve the same effect. This can lower the manufacturing cost and minify the room for the components.

Figure 7:
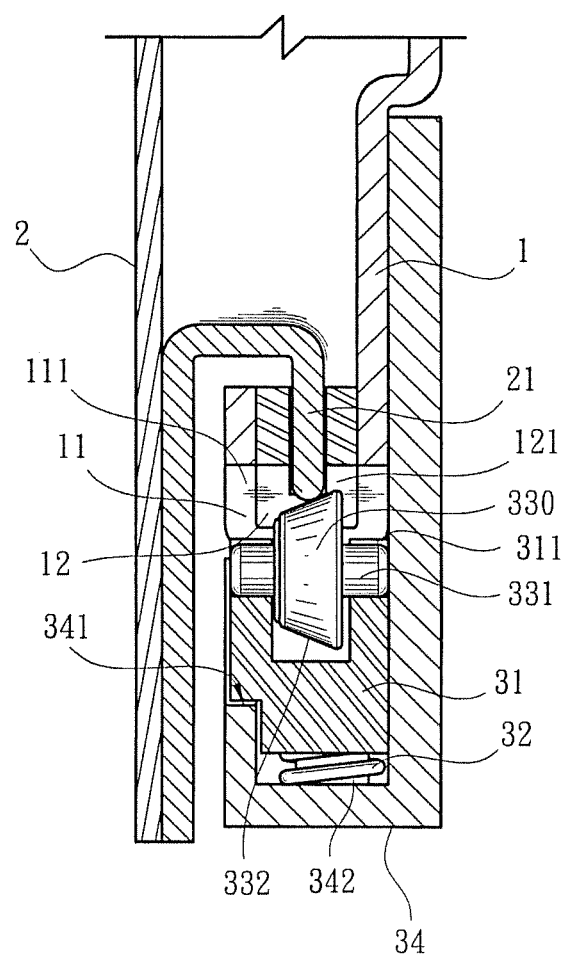
FIG. 7 is a sectional view showing the rolling member of a second embodiment of the present invention.

Please refer to FIG. 7. In the above embodiment, the rolling member 33 of the elastic abutment assembly is a cylindrical member. Alternatively, in another embodiment, the rolling member 330 is a beveled roller with a beveled rim 332. In this case, when the beveled rim 332 elastically abuts against the slide guide section (guide rail) 21, a force in the axial direction of the pivot shaft 331 is applied to the base seat 1 to prevent the base seat 1 from over-approaching the slide seat 2 or being over-spaced from the slide seat 2. This can satisfy other design requirements.

In conclusion, the slide cover stabilization/synchronization mechanism of the present invention enables a user to smoothly operate the slide cover without deflection. Also, by means of the slide cover stabilization/synchronization mechanism of the present invention, the gap between the base seat and the slide seat is minified to stabilize the operation and reduce the wear of the components.

The above embodiments are only used to illustrate the present invention, not intended to limit the scope thereof. Many modifications of the above embodiments can be made without departing from the spirit of the present invention.

What is claimed is:

1. A slide cover stabilization/synchronization mechanism comprising:
   a slide seat having two slide guide sections extending in parallel to each other;
   a base seat having two holding sections for fitting with the slide guide sections, whereby the base seat can be moved along the slide guide sections relative to the slide seat; and
   at least one elastic abutment assembly disposed on at least one of the holding sections, the elastic abutment assembly being positioned between the holding section and the slide guide section to at least partially elastically abut against the slide guide section, whereby the base seat can be slid relative to the slide seat to automatically elastically correct deflection;
   wherein each elastic abutment assembly at least includes an elastic member, which at least partially directly elastically abuts against the slide guide section.

2. The slide cover stabilization/synchronization mechanism as claimed in claim 1, wherein two elastic abutment assemblies are respectively disposed between the slide guide sections of the slide seat and the holding sections of the base seat.

3. The slide cover stabilization/synchronization mechanism as claimed in claim 2, wherein each elastic abutment assembly at least includes an elastic member, which at least partially directly elastically abuts against the slide guide section.

4. The slide cover stabilization/synchronization mechanism as claimed in claim 2, wherein each elastic abutment assembly at least includes the elastic member and a rolling member, the elastic member at least partially elastically abutting against the holding section, the rolling member elastically abutting against the slide guide section under elastic force of the elastic member.

5. The slide cover stabilization/synchronization mechanism as claimed in claim 4, wherein each elastic abutment assembly further includes a movable seat disposed between the rolling member and the elastic member, a bushing section being disposed on a first side of the movable seat and at least one cavity being formed on a second side of the movable seat opposite to the first side for receiving the elastic member, the rolling member having a central pivot shaft inserted in the bushing section.

6. The slide cover stabilization/synchronization mechanism as claimed in claim 2, wherein each holding section of the base seat is formed with at least one hollow receiving section, whereby the elastic abutment assembly extends from an outer side through the hollow receiving section to abut against the slide guide section.

7. The slide cover stabilization/synchronization mechanism as claimed in claim 6, wherein the rolling member is a beveled roller with a beveled rim.

8. The slide cover stabilization/synchronization mechanism as claimed in claim 2, wherein an outer jacket member is fixedly fitted on an outer side of each holding section of the base seat, the outer jacket member having a receiving space in which the elastic abutment assembly is received.

9. The slide cover stabilization/synchronization mechanism as claimed in claim 8, wherein multiple locating projections are disposed in the receiving space for locating the elastic members.

10. The slide cover stabilization/synchronization mechanism as claimed in claim 2, wherein each end section of each slide guide section is formed with at least one recessed locating section.

11. The slide cover stabilization/synchronization mechanism as claimed in claim 10, wherein the rolling member is a beveled roller with a beveled rim.

12. The slide cover stabilization/synchronization mechanism as claimed in claim 2, wherein the slide seat is a slide cover structure.

13. The slide cover stabilization/synchronization mechanism as claimed in claim 12, wherein the rolling member is a beveled roller with a beveled rim.

14. The slide cover stabilization/synchronization mechanism as claimed in claim 2, wherein the base seat is a part of a case of an electronic device.

15. The slide cover stabilization/synchronization mechanism as claimed in claim 14, wherein the rolling member is a beveled roller with a beveled rim.

16. The slide cover stabilization/synchronization mechanism as claimed in claim 1, wherein each elastic abutment assembly at least includes the elastic member and a rolling member, the elastic member at least partially elastically abutting against the holding section, the rolling member elastically abutting against the slide guide section under elastic force of the elastic member.

17. The slide cover stabilization/synchronization mechanism as claimed in claim 16, wherein each elastic abutment assembly further includes a movable seat disposed between the rolling member and the elastic member, a bushing section being disposed on a first side of the movable seat and at least one cavity being formed on a second side of the movable seat opposite to the first side for receiving the elastic member, the rolling member having a central pivot shaft inserted in the bushing section.

18. The slide cover stabilization/synchronization mechanism as claimed in claim 17, wherein each holding section of the base seat is formed with at least one hollow receiving section, whereby the elastic abutment assembly extends from an outer side through the hollow receiving section to abut against the slide guide section.

19. The slide cover stabilization/synchronization mechanism as claimed in claim 18, wherein the rolling member is a beveled roller with a beveled rim.

20. The slide cover stabilization/synchronization mechanism as claimed in claim 17, wherein an outer jacket member is fixedly fitted on an outer side of each holding section of the base seat, the outer jacket member having a receiving space in which the elastic abutment assembly is received.

21. The slide cover stabilization/synchronization mechanism as claimed in claim 20, wherein multiple locating projections are disposed in the receiving space for locating the elastic members.

22. The slide cover stabilization/synchronization mechanism as claimed in claim 20, wherein the rolling member is a beveled roller with a beveled rim.

23. The slide cover stabilization/synchronization mechanism as claimed in claim 17, wherein each end section of each slide guide section is formed with at least one recessed locating section.

24. The slide cover stabilization/synchronization mechanism as claimed in claim 17, wherein the rolling member is a beveled roller with a beveled rim.

25. The slide cover stabilization/synchronization mechanism as claimed in claim 16, wherein each holding section of the base seat is formed with at least one hollow receiving section, whereby the elastic abutment assembly extends from an outer side through the hollow receiving section to abut against the slide guide section.

26. The slide cover stabilization/synchronization mechanism as claimed in claim 25, wherein the rolling member is a beveled roller with a beveled rim.

27. The slide cover stabilization/synchronization mechanism as claimed in claim 16, wherein an outer jacket member is fixedly fitted on an outer side of each holding section of the base seat, the outer jacket member having a receiving space in which the elastic abutment assembly is received.

28. The slide cover stabilization/synchronization mechanism as claimed in claim 27, wherein multiple locating projections are disposed in the receiving space for locating the elastic members.

29. The slide cover stabilization/synchronization mechanism as claimed in claim 27, wherein the rolling member is a beveled roller with a beveled rim.

30. The slide cover stabilization/synchronization mechanism as claimed in claim 16, wherein each end section of each slide guide section is formed with at least one recessed locating section.

31. The slide cover stabilization/synchronization mechanism as claimed in claim 16, wherein the rolling member is a beveled roller with a beveled rim.

32. The slide cover stabilization/synchronization mechanism as claimed in claim 1, wherein each holding section of the base seat is formed with at least one hollow receiving section, whereby the elastic abutment assembly extends from an outer side through the hollow receiving section to abut against the slide guide section.

33. The slide cover stabilization/synchronization mechanism as claimed in claim 32, wherein an outer jacket member is fixedly fitted on an outer side of each holding section of the base seat, the outer jacket member having a receiving space in which the elastic abutment assembly is received.

34. The slide cover stabilization/synchronization mechanism as claimed in claim 33, wherein multiple locating projections are disposed in the receiving space for locating the elastic members.

35. The slide cover stabilization/synchronization mechanism as claimed in claim 32, wherein each end section of each slide guide section is formed with at least one recessed locating section.

36. The slide cover stabilization/synchronization mechanism as claimed in claim 32, wherein the rolling member is a beveled roller with a beveled rim.

37. The slide cover stabilization/synchronization mechanism as claimed in claim 1, wherein an outer jacket member is fixedly fitted on an outer side of each holding section of the base seat, the outer jacket member having a receiving space in which the elastic abutment assembly is received.

38. The slide cover stabilization/synchronization mechanism as claimed in claim 37, wherein multiple locating projections are disposed in the receiving space for locating the elastic members.

39. The slide cover stabilization/synchronization mechanism as claimed in claim 37, wherein the rolling member is a beveled roller with a beveled rim.

40. The slide cover stabilization/synchronization mechanism as claimed in claim 1, wherein each end section of each slide guide section is formed with at least one recessed locating section.

41. The slide cover stabilization/synchronization mechanism as claimed in claim 40, wherein the rolling member is a beveled roller with a beveled rim.

42. The slide cover stabilization/synchronization mechanism as claimed in claim 1, wherein the base seat is a part of a case of an electronic device.

43. A slide cover stabilization/synchronization mechanism comprising:

a slide seat having two slide guide sections extending in parallel to each other;

a base seat having two holding sections for fitting with the slide guide sections, whereby the base seat can be moved along the slide guide sections relative to the slide seat; and at least one elastic abutment assembly disposed on at least one of the holding sections, the elastic abutment assembly being positioned between the holding section and the slide guide section to at least partially elastically abut against the slide guide section, whereby the base seat can be slid relative to the slide seat to automatically elastically correct deflection;

wherein an outer jacket member is fixedly fitted on an outer side of each holding section of the base seat, the outer jacket member having a receiving space in which the elastic abutment assembly is received.

44. The slide cover stabilization/synchronization mechanism as claimed in claim 43, wherein each end section of each slide guide section is formed with at least one recessed locating section.

45. The slide cover stabilization/synchronization mechanism as claimed in claim 43, wherein multiple locating projections are disposed in the receiving space for locating the elastic members.

46. The slide cover stabilization/synchronization mechanism as claimed in claim 43, wherein the rolling member is a beveled roller with a beveled rim.

* * * * *